United States Patent [19]

Löwel

[11] Patent Number: 4,835,415
[45] Date of Patent: May 30, 1989

[54] CIRCUIT FOR AMPLIFYING AND SHAPING AN AC SIGNAL

[75] Inventor: Helmut Löwel, Nuremberg, Fed. Rep. of Germany

[73] Assignee: Standard Elektrik Lorenz Aktiengesellschaft, Stuttgart, Fed. Rep. of Germany

[21] Appl. No.: 157,482

[22] Filed: Feb. 22, 1988

[30] Foreign Application Priority Data

Feb. 20, 1987 [DE] Fed. Rep. of Germany ....... 3705403

[51] Int. Cl.⁴ .................... H03K 17/90; H03K 17/72; H03K 19/18; H03K 4/02
[52] U.S. Cl. .................................. 307/261; 307/305; 307/309; 328/32 R; 330/62
[58] Field of Search ............... 324/207, 208, 252, 173, 324/174, 178, 179; 338/32 R; 307/261, 490, 491, 499, 501, 515, 519, 268, 27, 28, 37, 264, 142, 305, 309; 330/62; 323/274, 249, 368

[56] References Cited

U.S. PATENT DOCUMENTS

| 3,435,323 | 3/1969 | Wieder | 307/309 |
| 3,535,626 | 10/1970 | Uemura | 338/32 R |
| 3,746,887 | 7/1973 | Lowel | 307/305 |
| 3,838,298 | 9/1974 | Torres | 307/309 |
| 4,491,742 | 1/1985 | Akamatsu | 307/305 |
| 4,683,429 | 7/1987 | Popovic | 307/309 |
| 4,733,177 | 3/1988 | Pawletko | 307/309 |

OTHER PUBLICATIONS

Elektronik 10/17.5.1985; Dipl.-Phys. August Petersen "Magnetoresistive Sensoren im Kfz".

Primary Examiner—Stanley D. Miller
Assistant Examiner—Nancy Thai
Attorney, Agent, or Firm—Spencer & Frank

[57] ABSTRACT

A circuit for amplifying a measurement signal having an AC component and obtained from the tap of a voltage divider which is connected via a dropping resistor to a supply voltage and includes at least one magneto-resistor, and for shaping the measurement signal into an output signal of approximately rectangular shape. To simplify the circuit and reduce the number and size of the components and leads to a minimum, the current produced by the supply voltage is changed essentially in accordance with the changes of the AC component of the measurement signal by connecting a controllable impedance into the supply-voltage lead, the impedance being controlled by the measurement signal.

14 Claims, 2 Drawing Sheets

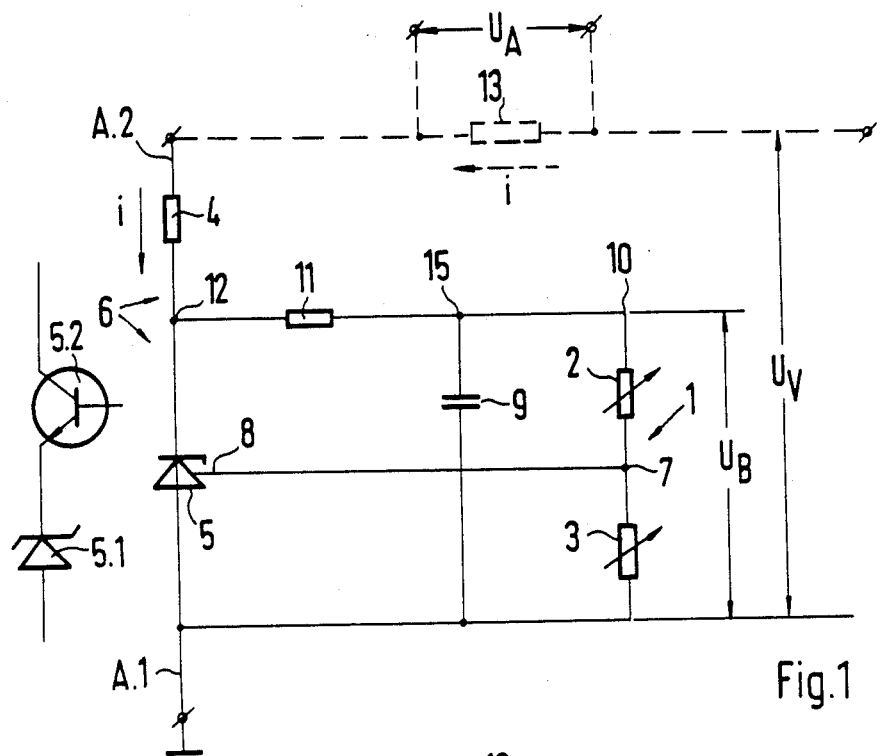
Fig. 1
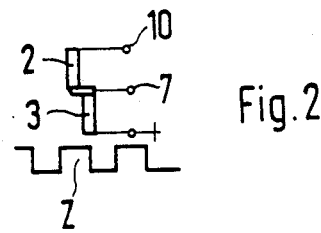
Fig. 2
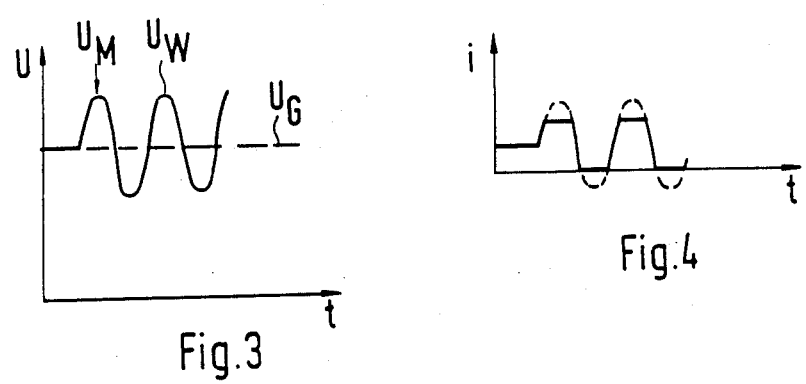
Fig. 3
Fig. 4

CIRCUIT FOR AMPLIFYING AND SHAPING AN AC SIGNAL

BACKGROUND OF THE INVENTION

The present invention relates to a circuit for amplifying and shaping an AC signal obtained from a tap of voltage divider including at least one magneto-resistor.

A circuit with a bridge circuit consisting of four magneto-resistors is described in "Elektronik", No. 10, May 17th, 1985, pp. 99 to 101, where on p. 100 an operational amplifier is used as a signal amplifier, and a Schmitt-trigger-connected operational amplifier as a pulse shaper. The supply voltage is assumed to be constant, and temperature compensation is effected by a PTC resistor via an additional amplifier and a voltage divider. Each of the leads to the signal amplifier contains a resistor for eliminating any temperature dependence of the gain. The prior art circuit requires at least four connecting leads, namely two for the supply voltage and two for the output signal.

An object of the present invention is to achieve amplification and signal shaping with a minimum of components and connecting leads.

This object is attained by obtaining from the tap of a voltage divider including at least one magneto-resistor a measurement signal having an AC component, and controlling a controllable impedance by this measurement signal. Since the circuit requires only a small number of small components, the latter can be housed in a single, two-lead package. Further advantageous details and will now be described with the aid of the embodiments illustrated in the accompanying drawings, in which:

BRIEF DESCRIPTION OF THE DRAWING

FIG. 1 shows a circuit diagram of the signal amplifying and shaping device of the present invention with an RC section;

FIG. 2 shows the arrangement of the magneto-resistors relative to the teeth of a gear or rack:

FIG. 3 shows the waveform of a measurement signal;

FIG. 4 shows the waveform of a shaped output signal, and

DESCRIPTION OF THE PREFERRED EMBODIMENT(S)

Figure 5:
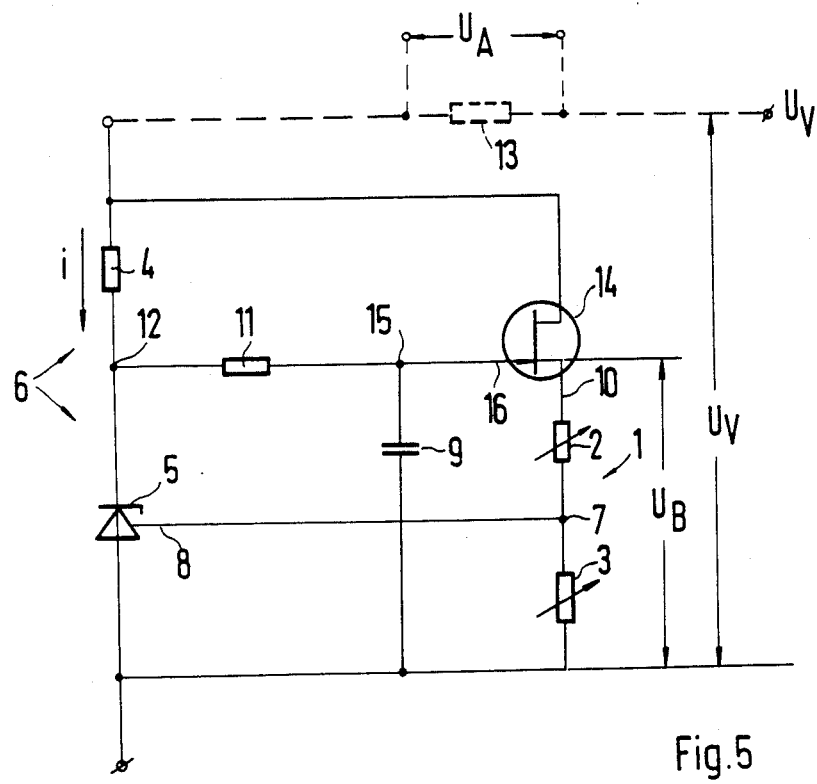
FIG. 5 shows a circuit diagram of another embodiment with a field-effect transistor controlled by the RC section.

The reference numeral 1 denotes a voltage divider consisting of two magneto-resistors 2 and 3. If the teeth of a gear or rack Z are spaced at regular intervals, the magneto-resistors 2 and 3 are displaced in relation to one another by a quarter of the tooth pitch, as shown in the sketch of FIG. 2. The voltage divider 1 may also consist of only one magneto-resistor and a normal resistor. It gets its operating voltage $U_B$ from a supply voltage UV via a dropping resistor 4.

Connected substantially in parallel with the voltage divider 1 is a controllable impedance 5, preferably a controllable zener diode, such as the IC type TL 431, or, as shown beside FIG. 1 on the left, a zener diode 5.1 in series with a transistor 5.2. By "substantially in parallel" is meant that the respective terminals of the controllable impedance 5 are coupled to the high and low terminals of the voltage divider 1 and the voltages thereacross are approximately equal. This controllable impedance 5 and the dropping resistor 4 form a second voltage divider 6. The tap 7 of the first voltage divider 1 is connected to the control input 8 of the controllable impedance 5. Also connected in parallel with the first voltage divider 1 is a capacitor 9, and a resistor 11 is interposed between the high end 10 of the voltage divider 1 and the tap 12 of the second voltage divider 6. The resistor 11 and the capacitor 9 form a timing RC section whose time constant is longer than the longest period of the AC voltage component $U_W$ at the tap 7 of the voltage divider 1, preferably 5 to 20 times as long.

The operation of the circuit is as follows:

The ferro-magnetic gear or rack Z, which may be magnetized, is arranged for moving relative to the two magneto-resistors 2, 3. If the gear or rack is not magnetized, the magneto-resistors have a permanent magnet associated therewith in a manner known per se. The magnetic field of the permanent magnet passes through the magneto-resistors, and its direction in the magneto-resistors is changed by the external ferro-magnetic part, thereby changing the resistance of the magneto-resistors. As the teeth of the gear Z move past the magneto-resistors 2, 3, which are displaced in relation to one another by a quarter of the tooth pitch, the resistance value of one magneto-resistor, e.g., 2, increases, and that of the other, 3, decreases, periodically and vice versa, from the same standard value. Thus, a measurement signal $U_M$ consisting of a DC component $U_G$ and an alternating voltage $U_W$ superimposed thereon is obtained at the tap 7. The measurement signal $U_M$ controls the impedance 5 in such a way that the voltage at the tap 12 increases as the voltage at the tap 7 decreases. Without the capacitor 9 and the resistor 11, this would necessitate increasing the operating voltage $U_B$ across the first voltage divider 1 until the voltage at the tap 7 equals the reference voltage at the control input of the controllable impedance 5. In the case of the IC type TL 431, this reference voltage is 2.5 V.

Because of the long time constant of the RC section 9, 11, the change in the value of the impedance 5 has no effect at the first voltage divider 1, i.e., no control takes place. The change in the impedance of the second voltage divider 6 causes a change in the current flowing through this voltage divider, so that the measurement signal UM is amplified. Across a resistor 13 in the supply-voltage lead (indicated by dashed lines), a corresponding output voltage $U_A$ can then be taken for further processing. This resistor may be inserted anywhere in the lead, so that no separate lead to or from the circuit need be provided.

If the voltage at the tap 7 in the uninfluenced condition of the magneto-resistors is chosen to be equal to the reference voltage of the controllable impedance 5, and the AC signal at the tap 7 is so large that the controllable impedance 5 is fully turned ON or OFF, a current will be obtained in the second voltage divider 6 which approximately represents a rectangular voltage and in which, as shown in FIG. 4, the peaks of the AC component $U_M$ can no longer cause any impedance changes.

If an integrated controllable impedance of the type TL 431 is used, changes in the values of the circuit, such as temperature changes or aging, and thus changes in the resistances of the magneto-resistors 2 and 3 or the other circuit components will be compensated for, because this integrated circuit incorporates internal temperature compensation. Therefore, the attainable output signal $U_A$ is highly stable. Moreover, only two connecting leads are necessary to operate the circuit.

In the circuit described, the implementation of a long time constant only allows the use of a relatively low-value resistor 11, so that a high-value capacitor 9 is required. To keep the value and, thus, the size of the capacitor 9 to a minimum, in a preferred embodiment of the invention, the drain-source path of a field-effect transistor 14 is connected between the high end 10 of the first voltage divider 1 and the high end of the dropping resistor 4, and the junction 15 of the capacitor 9 and the resistor 11 is connected to the gate 16 of the field-effect transistor 14 and, thus, via the gate-source path to the high end 10. The field-effect transistor 14 acts as an impedance-matching transformer and holds the high end 10 at a constant potential. Because of the very high input resistance of the field-effect transistor 14, only very small currents on the order of, e.g., a few picoamperes will flow in the gate-source path. The capacitor 9 can thus be made very small. In a practical embodiment, the value of the resistor 11 was the order of about 10 megohms to a few multiples thereof, and the value of the capacitor 9 was of the order of 100 nF.

A particular advantage is that the circuit can be constructed with a few, small components, so that the circuit, together with the first voltage divider, can be combined into a structural unit and housed in a single two-lead package. This permits the unit to be easily mounted a any desired point.

The present disclosure relates to the subject matter disclosed in German (Federal Republic of Germany) Patent Application Ser. No. P 37 05 403 filed Feb. 20th, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A circuit for amplifying a measurement signal having an AC component comprising:
   a voltage supply terminal for receiving a supply a dropping resistor having a terminal connected to said voltage supply terminal;
   a first voltage divider having at least one magneto-resistor, and a tap at which there appears the measurement signal, one end of said first voltage divider being connected via said dropping resistor to said supply voltage terminal;
   an output terminal;
   means for shaping the measurement signal into an output signal at said output terminal, of approximately rectangular shape, including
   a controllable impedance having a first terminal connected to said supply voltage terminal for changing a current from the supply voltage in accordance with changes of the AC component of the measurement signal; and
   control means, responsive to the measurement signal, for controlling the controllable impedance.

2. A circuit as claimed in claim 1, wherein the circuit components are contained in a single package having only two leads.

3. A circuit as claimed in claim 1, wherein said controllable impedance has said one end coupled to said first terminal and has another end coupled to said controllable impedance have approximately equal voltages thereacross said controllable impedance with said dropping resistor, forming a second voltage divider having a tap; said control means including said controllable impedance having a control electrode connected to said tap of said first voltage divider, the circuit further comprising
   a capacitor connected in parallel with said first voltage divider, and
   another resistor connected between said tap of said second voltage divider and the junction between said capacitor and said first voltage divider said junction providing an operating voltage, and said another resistor and said capacitor having an RC time constant longer than the longest period of the AC component at said tap of said first voltage divider.

4. A circuit as claimed in claim 3, wherein said controllable impedance is a controllable zener diode.

5. A circuit as claimed in claim 4, wherein the RC time constant is at least eight times the longest period of the AC component.

6. A circuit as claimed in claim 5, further comprising a field-effect transistor having a gate and having a drain-source path connected between said one end of said first voltage divider and said terminal of said dropping resistor, and said junction of said capacitor and said another resistor is connected to said gate of said field-effect transistor.

7. A circuit as claimed in claim 6, wherein the circuit components are contained in a single package having only two leads.

8. In circuit for amplifying a measurement signal having an AC component and obtained from a tap of a first voltage divider which is connected via a dropping resistor to a supply voltage at a voltage supply terminal and includes at least one magneto-resistor, the circuit including means for shaping the measurement signal into an output signal of at least approximately rectangular shape, the improvement comprising means for carrying a current produced by the supply voltage means responsive to changes of the AC component of the measurement signal, for changing the current produced by the supply voltage, said changing means including a controllable impedance in said carrying means carrying the current produced by the supply voltage and means, responsive to the measurement signal for controlling said controllable impedence, said changing means providing the output signal in said carrying means.

9. The improvement claimed in claim 8, wherein said controllable impedance is connected in parallel with said first voltage divider to form a second voltage divider with said dropping resistor and has a control electrode connected to said tap of said first voltage divider, the circuit further comprising a capacitor connected in parallel with said first voltage divider, and a further resistor connected between said tap of said second voltage divider and the junction of said capacitor and said first voltage divider, said junction being connected to an operating voltage, and said further resistor and said capacitor forming an RC section having a time constant longer than the longest period of the AC component at said tap of said first voltage divider.

10. The improvement as claimed in claim 8, wherein said controllable impedance is a controllable zener diode.

11. The improvement as claimed in claim 9, wherein the time constant is at least eight times as long as the longest period of the AC component.

12. The improvement as claimed in claim 9, further comprising a field-effect transistor having a gate and having a drain-source path connected between said one end of said first voltage divider and an end of the dropping resistor connected to said voltage supply terminal, and the junction of said capacitor and said further resistor is connected to said gate of said field-effect transistor.

13. The improvement as claimed in claim 8, wherein the circuit is contained as a structural unit in a single two-lead package.

14. The improvement as claimed in claim 9, wherein the circuit is contained as a structural unit in a single two-lead package.

* * * * *